United States Patent
Choi (10) Patent No.: US 9,755,597 B2
(45) Date of Patent: *Sep. 5, 2017

(54) FIXED GAIN AMPLIFIER CIRCUIT

(71) Applicant: STMicroelectronics, Inc., Coppell, TX (US)

(72) Inventor: Davy Choi, Carrollton, TX (US)

(73) Assignee: STMicroelectronics, Inc., Coppell, TX (US)

( * ) Notice: Subject to any disclaimer, the term of this patent is extended or adjusted under 35 U.S.C. 154(b) by 21 days.

This patent is subject to a terminal disclaimer.

(21) Appl. No.: 14/971,359

(22) Filed: Dec. 16, 2015

(65) Prior Publication Data

US 2016/0099696 A1  Apr. 7, 2016

Related U.S. Application Data

(63) Continuation of application No. 14/296,914, filed on Jun. 5, 2014, now Pat. No. 9,246,458.

(51) Int. Cl.
  *H03F 3/45* (2006.01)
  *H03G 3/02* (2006.01)
  *H03G 1/00* (2006.01)
  *H03F 1/02* (2006.01)
  (Continued)

(52) U.S. Cl.
  CPC ............ *H03G 3/02* (2013.01); *H03F 1/0205* (2013.01); *H03F 1/26* (2013.01); *H03F 3/3022* (2013.01);
  (Continued)

(58) Field of Classification Search
  CPC .. H03G 1/0023; H03G 1/0088; H03G 1/0029; H03G 3/3042; H03G 3/3036;
  (Continued)

(56) References Cited

U.S. PATENT DOCUMENTS 5,999,052 A    12/1999  Tang
6,020,785 A     2/2000  Allen et al.
(Continued)

OTHER PUBLICATIONS

Donald A. Kerth, et al: "An Oversampling Converter for Strain Gauge Transducers," IEEE Journal of Solid-State Circuits, vol. 27, No. 12, Dec. 1992, pp. 1689-1696.

*Primary Examiner* — Khanh V Nguyen
(74) *Attorney, Agent, or Firm* — Gardere Wynne Sewell LLP (57) ABSTRACT

An instrumentation amplifier includes first and second resistors for gain setting. The operational amplifiers within the instrumentation amplifier include selectively enabled current drive sources coupled to the amplifier output. The first and second resistors have variable resistances. A control circuit is configured to select the variable resistances of the first and second resistors to implement a fixed gain for the instrumentation amplifier and further selectively enable the current drive sources. The control circuit receives an indication of a downstream programmable gain (for example, from a downstream programmable gain amplifier). The variable resistances of the first and second resistors are selected to be scaled inversely with respect to the downstream programmable gain and the current drive sources are enabled proportionately with respect to the downstream programmable gain.

18 Claims, 7 Drawing Sheets

(51) Int. Cl.
    *H03F 1/26*     (2006.01)
    *H03F 3/30*     (2006.01)
    *H03F 3/393*     (2006.01)
    *H03G 1/02*     (2006.01)
    *H03G 3/30*     (2006.01)
    *H03M 1/18*     (2006.01)

(52) U.S. Cl.
    CPC ......... *H03F 3/393* (2013.01); *H03F 3/45094* (2013.01); *H03F 3/45179* (2013.01); *H03F 3/45475* (2013.01); *H03G 1/0035* (2013.01); *H03G 1/02* (2013.01); *H03G 3/3036* (2013.01); *H03F 3/45* (2013.01); *H03F 2200/261* (2013.01); *H03F 2203/45116* (2013.01); *H03F 2203/45138* (2013.01); *H03F 2203/45336* (2013.01); *H03M 1/18* (2013.01)

(58) Field of Classification Search
    CPC ............... H03G 1/007; H03F 3/45183; H03F 2203/45702; H03F 3/45475; H03F 2203/45138; H03F 3/454

USPC .......................... 330/69, 254, 278, 279, 282
See application file for complete search history.

(56) References Cited

U.S. PATENT DOCUMENTS

| | | | |
|---|---|---|---|
| 7,154,331 B2* | 12/2006 | Zaguri | H03F 3/45183 330/254 |
| 7,202,741 B2 | 4/2007 | Park et al. | |
| 8,324,969 B2 | 12/2012 | Loeda et al. | |
| 8,618,888 B2* | 12/2013 | Kim | H03K 3/0322 331/182 |
| 8,823,453 B2* | 9/2014 | Nys | H03F 3/3022 330/69 |
| 2005/0285674 A1 | 12/2005 | Zaguri | |
| 2009/0096528 A1 | 4/2009 | Nakai et al. | |
| 2014/0167852 A1* | 6/2014 | Ishigami | H03F 1/0261 330/261 |

\* cited by examiner

FIXED GAIN AMPLIFIER CIRCUIT

CROSS-REFERENCE TO RELATED APPLICATION

This application is a continuation application from U.S. patent application Ser. No. 14/296,914 filed Jun. 5, 2014, the disclosure of which is incorporated by reference.

TECHNICAL FIELD

This invention relates generally to electronic circuits, and more particularly to fixed gain amplifier (FGA) circuits.

BACKGROUND

Figure 1:
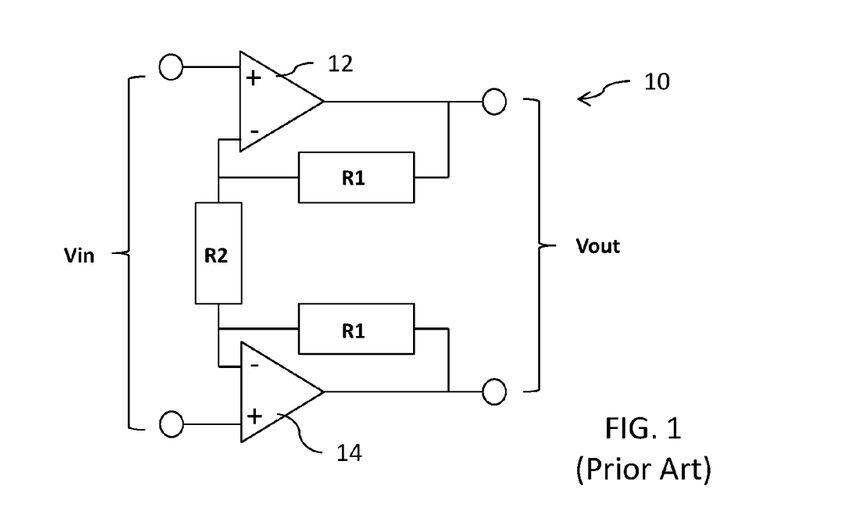
FIG. 1 shows a conventional instrumentation amplifier circuit.

Reference is now made to FIG. 1 illustrating a circuit diagram for a conventional instrumentation amplifier circuit 10 as known to those skilled in the art. The circuit 10 includes a first input buffer amplifier 12 and a second input buffer amplifier 14. The amplifiers 12 and 14 are typically formed as operational amplifiers (OPAMPs). The non-inverting (+) input terminals of amplifiers 12 and 14 are configured to receive a differential input signal Vin. The inverting (−) input terminal of amplifier 12 is coupled by a feedback resistor R1 to the amplifier output terminal. Likewise, the inverting (−) input terminal of amplifier 14 is coupled by a feedback resistor R1 to the amplifier output terminal. A resistor R2 is coupled between the inverting (−) input terminal of amplifier 12 and the inverting (−) input terminal of amplifier 14. A differential output signal Vout is generated at the output terminals of the amplifiers 12 and 14. The gain (G) of the amplifier circuit 10 is given by the following equation: $G=1+(2*R1/R2)$.

The amplifier circuit 10 may be used as a fixed gain amplifier (FGA) by setting the values of R1 and R2 in order to achieve a desired gain G. Alternatively, the amplifier circuit 10 may be used as a variable gain amplifier (VGA) or programmable gain amplifier (PGA) by adjusting the values of R1 and R2. In a preferred implementation, the resistor R2 is provided as a variable resistor to control the amplifier gain G using changes made to a single resistor.

Figure 2:
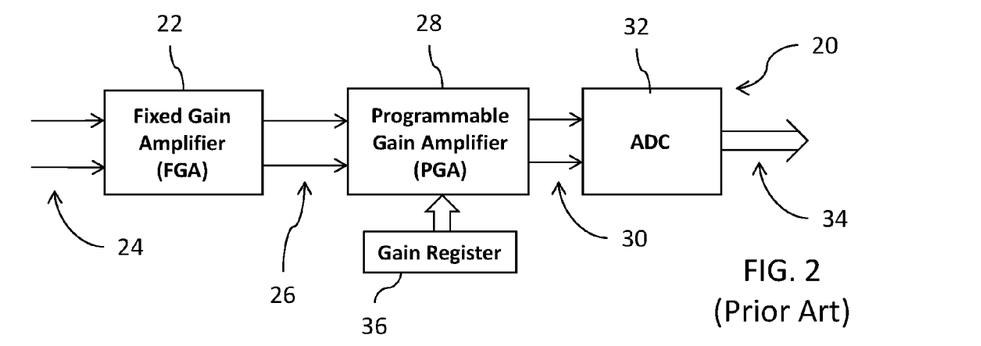
FIGS. 2 and 3 illustrate conventional signal processing paths.

FIG. 2 illustrates a conventional signal processing path 20 including a fixed gain amplifier (FGA) 22 configured to receive a differential input signal 24 and output a first differential output signal 26 with a fixed gain Gf. The path 20 further includes a programmable gain amplifier (PGA) 28 configured to receive the first differential output signal 26 and output a second differential output signal 30 with a programmable gain Gp. The second differential output signal 30 is then converted by an analog-to-digital converter (ADC) 32 to generate a digital output signal 34. The path 20 further includes a gain register (or other control circuit) 36 coupled to the programmable gain amplifier 28. The data value loaded into the gain register 36 sets the programmable gain Gp.

Figure 3:
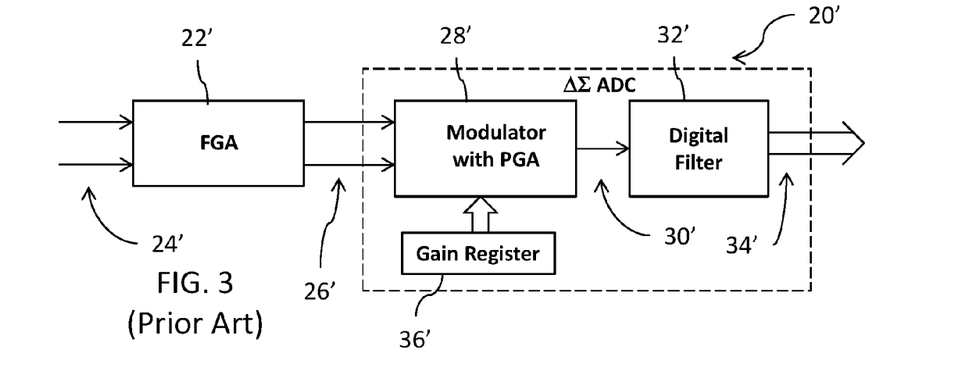

FIG. 3 illustrates a conventional signal processing path 20' including a fixed gain amplifier (FGA) 22' configured to receive a differential input signal 24' and output a first differential output signal 26' with a fixed gain Gf. The path 20' further includes an analog modulator of a ΔΣ type including a modulator 28' with a programmable gain amplification (PGA) functionality generating a signal 30' with a programmable gain Gp. The signal 30' is then filtered by a filter 32' to generate a digital output signal 34'. The path 20' further includes a gain register (or other control circuit) 36' coupled to the programmable gain amplification functionality of the modulator 28'. The data value loaded into the gain register 36' sets the programmable gain Gp.

The paths 20 and 20' advantageously function to gain up the input analog signal 24/24' prior to digitization. It is recognized that the input analog signal 24/24' may be output from a source (such as a sensor) having different signal sensitivities. To maximize system signal-to-noise ratio (SNR), it is important to gain up the different input signals proportionally such that about the same analog signal amplitude is present, regardless of signal source, at the input of the analog-to-digital conversion phase. Those skilled in the art further understand that the gain settings (Gf and Gp) should preferably be greater than unity and that when multiple gain up stages are present the higher gain settings should process the signal first. Thus, it is preferred to use a relatively higher fixed gain Gf at the first gain up stage.

With respect to an analog-to-digital conversion referenced to a reference voltage Vref, the input full-scale-range (FSR) is given by the following equation: $FSR=Vref/(Gf*Gp)$. In this context, the FSR is the maximum input signal that is allowed by the path 20/20' without incurring output code saturation at the analog-to-digital converter. Thus, the optimal setting of the fixed gain Gf for a given signal source is the gain at which the maximum expected analog output signal (prior to conversion) is close to without exceeding the reference voltage Vref.

The fixed gain amplifier (FGA) 22/22' in FIGS. 2 and 3 may, for example, comprise the instrumentation amplifier circuit 10 of FIG. 1 with the resistors R1 and R2 set to achieve the desired fixed gain Gf in accordance with the following equation: $Gf=1+(2*R1/R2)$. The differential input signal 24/24' has a common mode voltage Vcm>0, and thus the first differential output signal 26/26' will have a corresponding common mode voltage Vcm. The common mode voltage must be set at a value which ensures that the differential output signal 26/26' is not clipped (i.e., goes too negative or too positive towards the supply rails for the amplifiers 12 and 14 to handle). With the analog-to-digital conversion referenced to a reference voltage Vref, the maximum output for the first differential output signal 26/26' must be less than or equal to Vref/Gp so as to ensure the analog-to-digital conversion is not saturated.

Increasing the programmable gain Gp value to provide sufficient amplification prior to analog-to-digital conversion with respect to a smaller magnitude differential input signal 24/24' raises a power dissipation concern. The power dissipation in the fixed gain amplifier is a function of the current flowing through the resistors R1 and R2 as well as the static (quiescent) current of the OPAMPs. The current flowing through the resistors is inversely proportional to programmable amplifier gain. Additionally, output swing changes with change in the programmable gain Gp value. When the programmable gain Gp value decreases, output swing increases. This means that there is more power dissipation in the fixed gain amplifier for lower programmable gain Gp values than for higher programmable gain Gp values. A need thus exists to address the dissipated power of the path 20/20' as the programmable gain Gp value is changed.

SUMMARY

In an embodiment, a circuit comprises: a differential amplifier having a plurality of selectively enabled current drive sources coupled to an output; a resistor circuit coupled to the differential amplifier and having a variable resistance; a control circuit configured to select the variable resistance of the resistor circuit to implement a fixed gain at the output and further selectively enable the current drive sources, said control circuit receiving an indication of a downstream programmable gain; and wherein a number of the current drive sources that are enabled by the control circuit is proportional to the downstream programmable gain.

In an embodiment, a circuit comprises: an instrumentation amplifier including an operational amplifier and first and second resistors coupled to the operational amplifier for gain setting, wherein the operational amplifier includes selectively enabled current drive sources coupled to an amplifier output; wherein the first and second resistors each have a variable resistance; and a control circuit configured to select the variable resistances of the first and second resistors to implement a fixed gain for the instrumentation amplifier, the selected variable resistances of the first and second resistors being scaled inversely with respect to a downstream programmable gain; wherein said control circuit is further configured to selectively enable a number of the current drive sources proportionally with respect to the downstream programmable gain.

In an embodiment, a method comprises: setting a fixed gain of an instrumentation amplifier; receiving an indication of a downstream programmable gain; and enabling a number of output current drive sources of the instrumentation amplifier proportionately with respect to the downstream programmable gain.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 4:
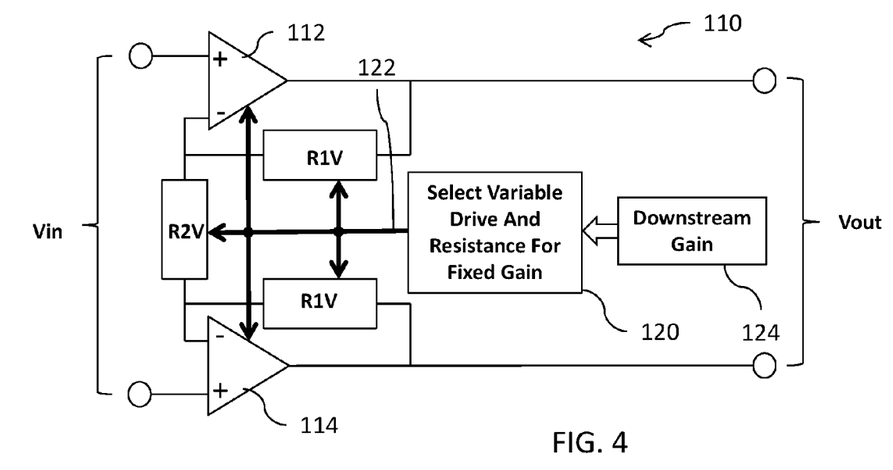
FIG. 4 shows a fixed gain amplifier.

Reference is now made to FIG. 4 which shows a circuit diagram for a fixed gain amplifier (FGA) circuit 110. The amplifier circuit 110 has an instrumentation amplifier circuit configuration including a first input buffer amplifier 112 and a second input buffer amplifier 114. The amplifiers 112 and 114 each comprise an operational amplifier (OPAMP) having a variable output drive current. The non-inverting (+) input terminals of amplifiers 112 and 114 are configured to receive a differential input signal Vin. The inverting (−) input terminal of amplifier 112 is coupled by a variable feedback resistor R1V to the amplifier output terminal. Likewise, the inverting (−) input terminal of amplifier 114 is coupled by a variable feedback resistor R1V to the amplifier output terminal. A variable resistor R2V is coupled between the inverting (−) input terminal of amplifier 112 and the inverting (−) input terminal of amplifier 114. A differential output signal Vout is generated at the output terminals of the amplifiers 112 and 114. The gain (G) of the amplifier circuit 110 is given by the following equation: $G=1+(2*R1V/R2V)$.

The amplifier circuit 110 further comprises a control circuit 120 configured to control selection of the variable output drive current for each amplifier 112 and 114 and further control selection of the variable resistance for the resistors R1V and R2V. This control is exercised through data output on a data bus 122 that is coupled to the variable resistors R1V and R2V as well as the amplifiers 112 and 114. Because the amplifier circuit 110 implements a fixed gain (Gf), the control circuit 120 ensures that the selections made for the variable resistance of the resistors R1V and R2V maintain the desired fixed gain. For example, suppose a fixed gain Gf=34 is desired. To implement this fixed gain, a first set of variable resistance values may be selected for the resistors R1V and R2V by the control circuit 120 such that R1V=49.5 kΩ and R2V=3 kΩ (wherein Gf=1+(2*49.5/3)= 34). Alternatively, a second set of variable resistance values may be selected for the resistors R1V and R2V by the control circuit 120 such that R1V=198 kΩ and R2V=12 kΩ (wherein Gf=1+(2*198/12)=34). It will be understood that many different combinations of resistance values for resistors R1V and R2V may be selected to achieve a same fixed gain Gf value.

Figure 5:
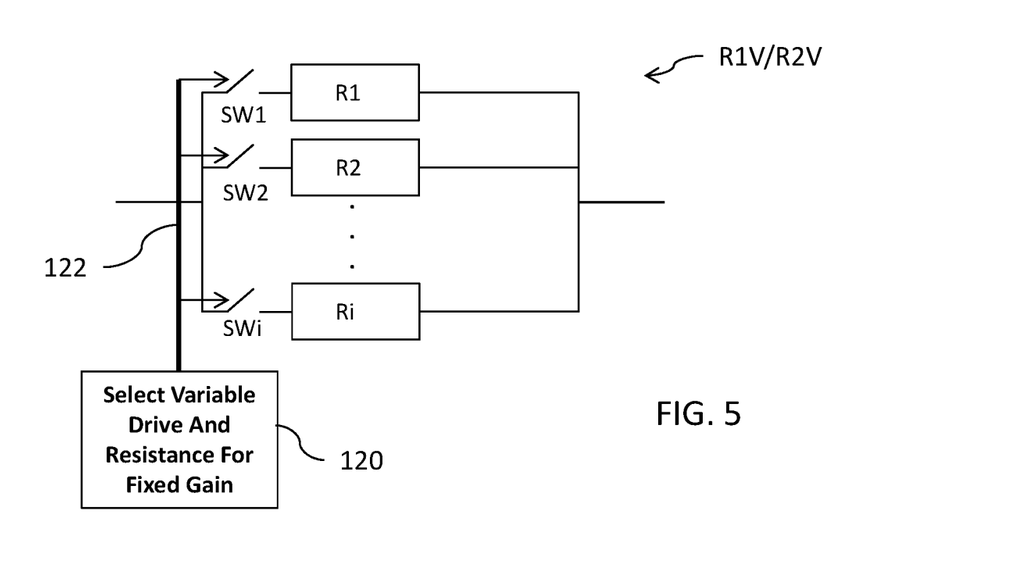
FIG. 5 illustrates a configuration for a variable resistor used in the fixed gain amplifier of FIG. 4.

Reference is now made to FIG. 5. The variable resistors R1V and R2V are each configured to include a plurality of individual resistors Ri that are selectively connected by switches SWi in parallel to each other. The control circuit 120 is configured to control selection of the variable resistance for the resistors R1V and R2V using data output on the data bus 122. In an implementation, certain bits of data on the data bus 122 correspond to certain ones of the switches SWi, and the logic state of that data bit controls whether the switch is open or closed. In an example, i=8 and the data bus 122 may, for example, be at least 8 lines wide, or perhaps i=16 and the data bus 122 may, for example, be at least 16 lines wide. Each of the individual resistors Ri preferably has a same resistance value Rmax (i.e., the resistors are matched), and thus the variable resistance is equal to Rmax/p, where p equals the number of switches SWi closed by the data on the data bus 122.

For the example above with Gf=34, each of the resistors R1V and R2V may include sixteen individual resistors Ri (i=16) selectively coupled in parallel by sixteen switches SWi (i=16) with Rmax for the variable resistors R1V=792 kΩ and Rmax for the variable resistor R2V=48 kΩ. If p=1, then the fixed gain Gf=1+(2*792/48)=34. If p=2, then the fixed gain Gf=1+(2*396/24)=34. Thus, the gain of the amplifier circuit 110 can remain fixed at a desired gain value while the values of the resistors R1V and R2V are changed for a given application.

Figure 6:
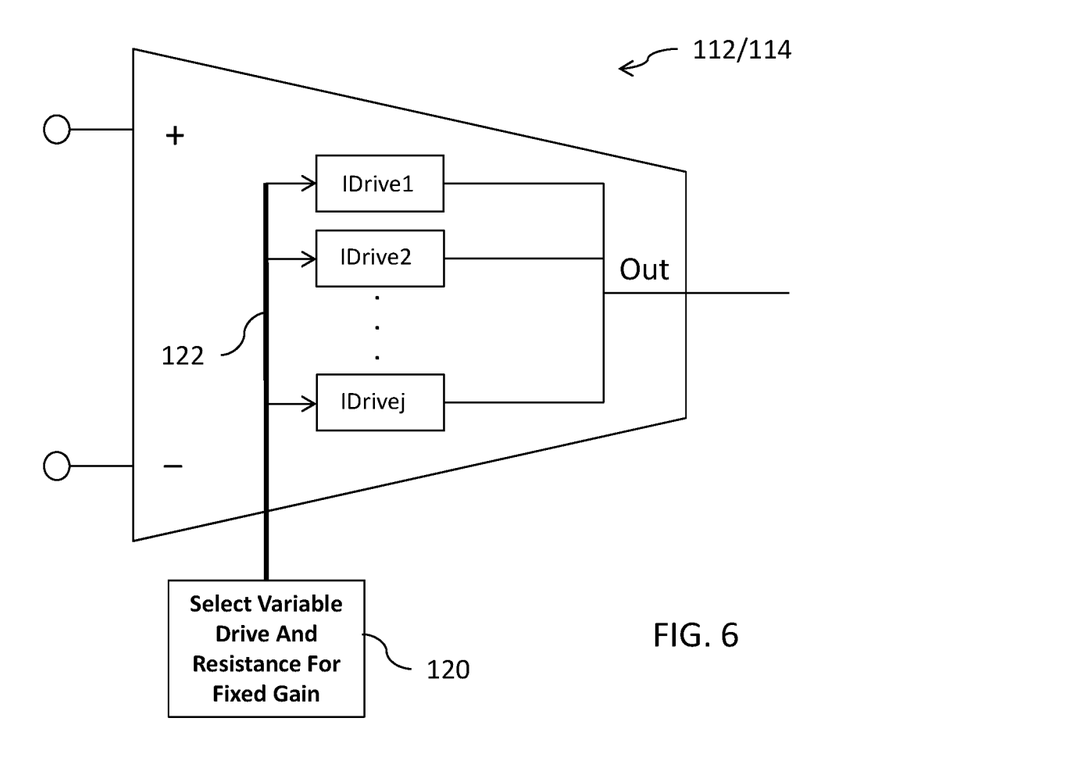
FIG. 6 illustrates a configuration for an operational amplifier with variable drive current used in the fixed gain amplifier of FIG. 4.

Reference is now made to FIG. 6. The operational amplifiers (OPAMPs) 112 and 114 having a variable output drive current include a plurality of current drive circuits (IDrivej) that are selectively enabled to source/sink current at the amplifier output. The control circuit 120 is configured to control selection of the current drive circuits IDrivej using data output on the data bus 122. In an implementation, certain bits of data on the data bus 122 correspond to certain ones of the current drive circuits IDrivej, and the logic state of that data bit controls whether the current drive circuit is enabled or disabled. In an example, j=8 and the data bus 122 is at least 8 lines wide, or perhaps j=16 and the data bus 122 may, for example, be at least 16 lines wide. In an embodiment, each of the individual current drive circuits IDrivej may have a same drive capacity value Iunit (i.e., the drive circuits are matched), and thus the variable output drive current is equal to m*Iunit, where m equals the number of current drive circuits IDrivej enabled by the data on the data bus 122. Alternatively, the individual current drive circuits IDrivej may have different drive capacity values, with the variable output drive current is equal to the sum of the m enabled drive circuits.

From a noise point of view, a circuit or system which includes the amplifier circuit 110 of FIG. 4 can tolerate more "4kTRΔf" noise with respect to the resistors R1V and R2V when the output signal (Vout) has a larger magnitude. In this context, if the amplifier circuit 110 is a first fixed gain amplifier stage of a multi-stage amplifier with a downstream variable or programmable gain amplifier (see, for example, the signal paths illustrated in FIGS. 2 and 3), then the generation of an output signal (Vout) with larger magnitude means that a smaller programmable gain value is needed for the downstream programmable amplification. Therefore, to manage a reasonable power dissipation, the control circuit 120 selects the resistance values for the resistors R1V and R2V to set the desired fixed gain value (Gf) while simultaneously scaling the resistance values inversely with respect to the downstream programmable gain value (Gp). In this regard, power dissipation in the amplifier is a function of the current flowing through the resistors R1V and R2V as well as the static (quiescent) current of the OPAMPs. The current flowing through the resistors is inversely proportional to amplifier gain and resistance. The scaling of the resistance values inversely with respect to the downstream programmable gain value (Gp) provide for a constant current and control over power dissipation.

The control circuit 120 receives an indication 124 of the downstream programmable gain (Gp) and responds to make a selection through the data bus 122 to actuate switches SWi and connect resistors Ri to define the resistance of the resistors R1V and R2V. Because of the inverse scaling relationship, the control circuit 120 responds to an indication 124 of a relatively lower downstream programmable gain (Gp) with the actuation of fewer switches SWi resulting in a relatively higher resistance for the resistors R1V and R2V. Conversely, for an indication 124 of a relatively higher downstream programmable gain (Gp), the control circuit 120 actuates more switches SWi coupling more resistors Ri in parallel and resulting in a relatively lower resistance for each of the resistors R1V and R2V. Notwithstanding the variation of the resistances for the resistors R1V and R2V, the control circuit 120 ensures that the selected resistance values will produce the desired fixed gain Gf.

The foregoing may be better understood by reference to the following table which illustrates an exemplary implementation to effectuate a fixed gain Gf=34 while inversely varying the resistances of the resistors R1V and R2V in response to the downstream programmable gain (Gp) value:

| Gp | R1V | R2V | Gf |
| --- | --- | --- | --- |
| 1-3 | 792 kΩ | 48 kΩ | 34 |
| 4, 6 | 396 kΩ | 24 kΩ | 34 |
| 8, 12 | 198 kΩ | 12 kΩ | 34 |
| 16, 24 | 99 kΩ | 6 kΩ | 34 |
| 32 | 49.5 kΩ | 3 kΩ | 34 |

In the exemplary implementation, it will be noted that the control circuit 120 selects certain resistances of the resistors R1V and R2V for use with certain downstream programmable gain (Gp) values in accordance with a binary weighted implementation. As an alternative, the control circuit 120 may be implemented to select different resistances of the resistors R1V and R2V for many more individual downstream programmable gain (Gp) values with a higher degree of granularity.

The amplifiers 112 and 114 of the circuit 110 need to have a large open-loop gain in order to achieve accuracy in the closed closed-loop gain for the fixed gain setting. The resistors R1V and R2V are loads on the output of each amplifier 112/114. As discussed above, the control circuit 120 chooses smaller resistance values for the resistors R1V and R2V (to achieve the same fixed gain Gf) in response to increase of the downstream programmable gain (Gp) value. As a result of smaller load resistance, the open-loop gain of the amplifiers 112 and 114 drops and the accuracy of the fixed gain setting is compromised. To compensate for this drop in open-loop gain and thus ensure accuracy of the fixed gain setting, the current drive circuits IDrivej are selectively enabled by the control circuit 120 through the data bus to provide for increased output drive. Thus, the number of enabled current drive circuits IDrivej (more particularly, the magnitude of the drive current) scales proportionately with respect to the downstream programmable gain value (Gp).

The foregoing may be better understood by reference to the following table which illustrates an exemplary implementation to effectuate a fixed gain Gf=34 while inversely varying the resistances of the resistors R1V and R2V in response to the downstream programmable gain (Gp) value:

| Gp | R1V | R2V | Drive Current | Gf |
| --- | --- | --- | --- | --- |
| 1-3 | 792 kΩ | 48 kΩ | 6 μA | 34 |
| 4, 6 | 396 kΩ | 24 kΩ | 10 μA | 34 |
| 8, 12 | 198 kΩ | 12 kΩ | 14 μA | 34 |
| 16, 24 | 99 kΩ | 6 kΩ | 20 μA | 34 |
| 32 | 49.5 kΩ | 3 kΩ | 20 μA | 34 |

In the exemplary implementation, it will be noted that the control circuit 120 enables certain current drive circuits IDrivej to provide drive current values for use with certain downstream programmable gain (Gp) values in accordance with a binary weighted implementation. As an alternative, the control circuit 120 may be implemented to enable current drive circuits IDrivej to provide different current drive values for many more individual downstream programmable gain (Gp) values with a higher degree of granularity.

Figure 7:
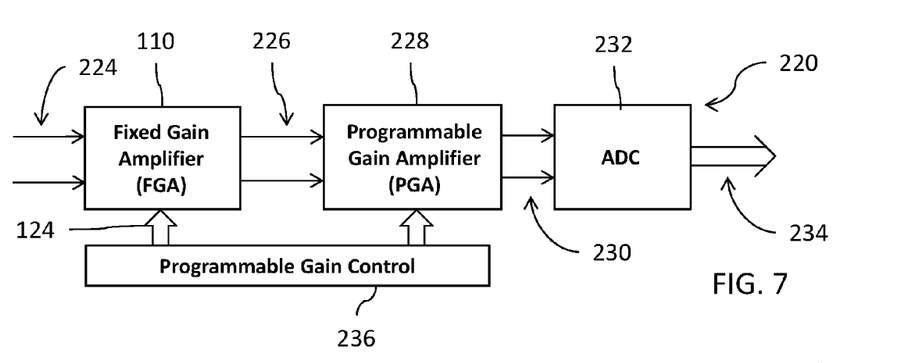
FIGS. 7 and 8 illustrate signal processing paths including the fixed gain amplifier of FIG. 4.

FIG. 7 illustrates a signal processing path 220 including a fixed gain amplifier (FGA) 110 (as shown in FIG. 4) configured to receive a differential input signal 224 and output a first differential output signal 226 with a fixed gain Gf. The path 220 further includes a programmable gain amplifier (PGA) 228 configured to receive the first differential output signal 226 and output a second differential output signal 230 with a programmable gain Gp. The second differential output signal 230 is then converted by an analog-to-digital converter (ADC) 232 to generate a digital output signal 234. The path 220 further includes a programmable gain control circuit 236 coupled to both the programmable gain amplifier 228 and the fixed gain amplifier 110. The programmable gain control circuit 236 sets the programmable gain Gp to be implemented by the programmable gain amplifier 228. That downstream programmable gain (Gp)

value is also provided (124) to the control circuit 120 of the fixed gain amplifier 110. The control circuit 120 responds to the indication 124 by activating switches SWi to select resistances Ri for connection forming each of the resistors R1V and R2V to provide the desired fixed gain Gf with resistance values scaled inversely with respect to the downstream programmable gain (Gp) value. The control circuit 120 further responds to the indication 124 by enabling current drive circuits IDrivej to provide current drive scaled proportionately with respect to the downstream programmable gain (Gp) value.

Figure 8:
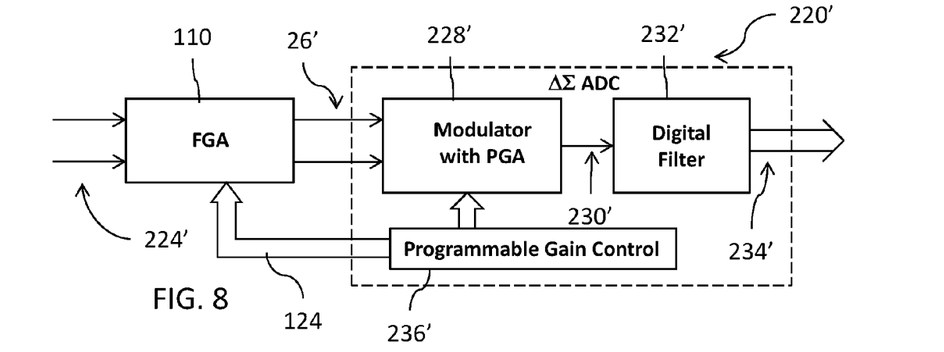

FIG. 8 illustrates a signal processing path 220' including a fixed gain amplifier (FGA) 110 (as shown in FIG. 4) configured to receive a differential input signal 224' and output a first differential output signal 226' with a fixed gain Gf. The path 220' further includes an analog modulator of a ΔΣ type including a modulator 228' with a programmable gain amplification (PGA) functionality generating a signal 230' with a programmable gain Gp. The signal 230' is then filtered by a filter 232' to generate a digital output signal 234'. The path 220' further includes a programmable gain control circuit 236' coupled to both the programmable gain amplification functionality of the modulator 228' and the fixed gain amplifier 110. The programmable gain control circuit 236' sets the programmable gain Gp to be implemented by the modulator 228'. That downstream programmable gain (Gp) value is also provided (124) to the control circuit 120 of the fixed gain amplifier 110. The control circuit 120 responds to the indication 124 by activating switches SWi to select resistances Ri for connection forming each of the resistors R1V and R2V to provide the desired fixed gain Gf with resistance values scaled inversely with respect to the downstream programmable gain (Gp) value. The control circuit 120 further responds to the indication 124 by enabling current drive circuits IDrivej to provide current drive scaled proportionately with respect to the downstream programmable gain (Gp) value.

Reference is once again made to FIG. 4. The control circuit 120 may comprise any circuitry suitable for receiving the indication 124 and controlling switch SWi actuation and enabling current drive circuits IDrivej. As an example, the control circuit 120 may comprise a logic circuit, such as a decoder, which decodes a digital signal indicative of the downstream programmable gain (Gp) value and generates the switch control and current drive enable signals in response to that value. As another example, the control circuit 120 may comprise a microcontroller (or other programmable control or processing circuit) which is programmed to implement a suitable algorithm for processing the downstream programmable gain (Gp) value to choose switches for actuation and drive circuits to be enabled. In yet another example, the control circuit 120 may include a register which is loaded with a digital value corresponding to the downstream programmable gain (Gp) value, with the logic value of the register bits controlling switch actuation and enabling of drive circuits.

Figure 9:
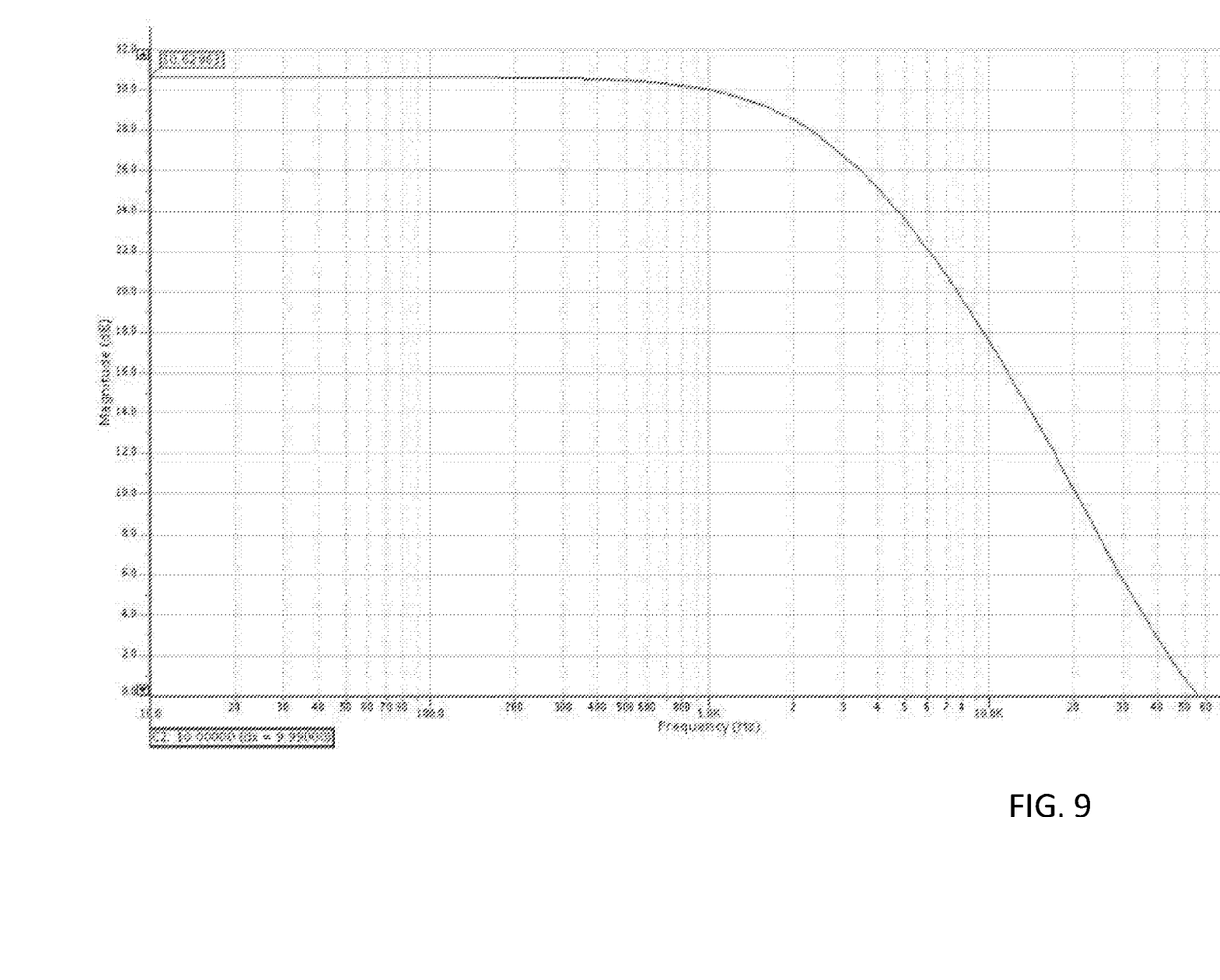
FIG. 9 illustrates an exemplary frequency response for a simulation of the path of FIG. 7.

A simulation of the path 220 of FIG. 7 was performed to determine the frequency response of the path. FIG. 9 illustrates the gain response of the fixed gain amplifier 110 and programmable gain amplifier (PGA) 228 (with the analog-to-digital converter (ADC) 232 as load) with Gf=34 and Gp=1. Similar results were achieved for other programmable gain (Gp) values. The table below summarizes the frequency response analysis:

| Gp | Gf | F(−3 dB) | GBW |
|---|---|---|---|
| 1 | 34 | 2.525 kHz | 56.04 kHz |
| 4 | 34 | 2.497 kHz | 58.47 kHz |
| 8 | 34 | 2.467 kHz | 58.05 kHz |
| 16 | 34 | 2.438 kHz | 55.79 kHz |
| 32 | 34 | 2.334 kHz | 53.23 kHz |

Figure 10:
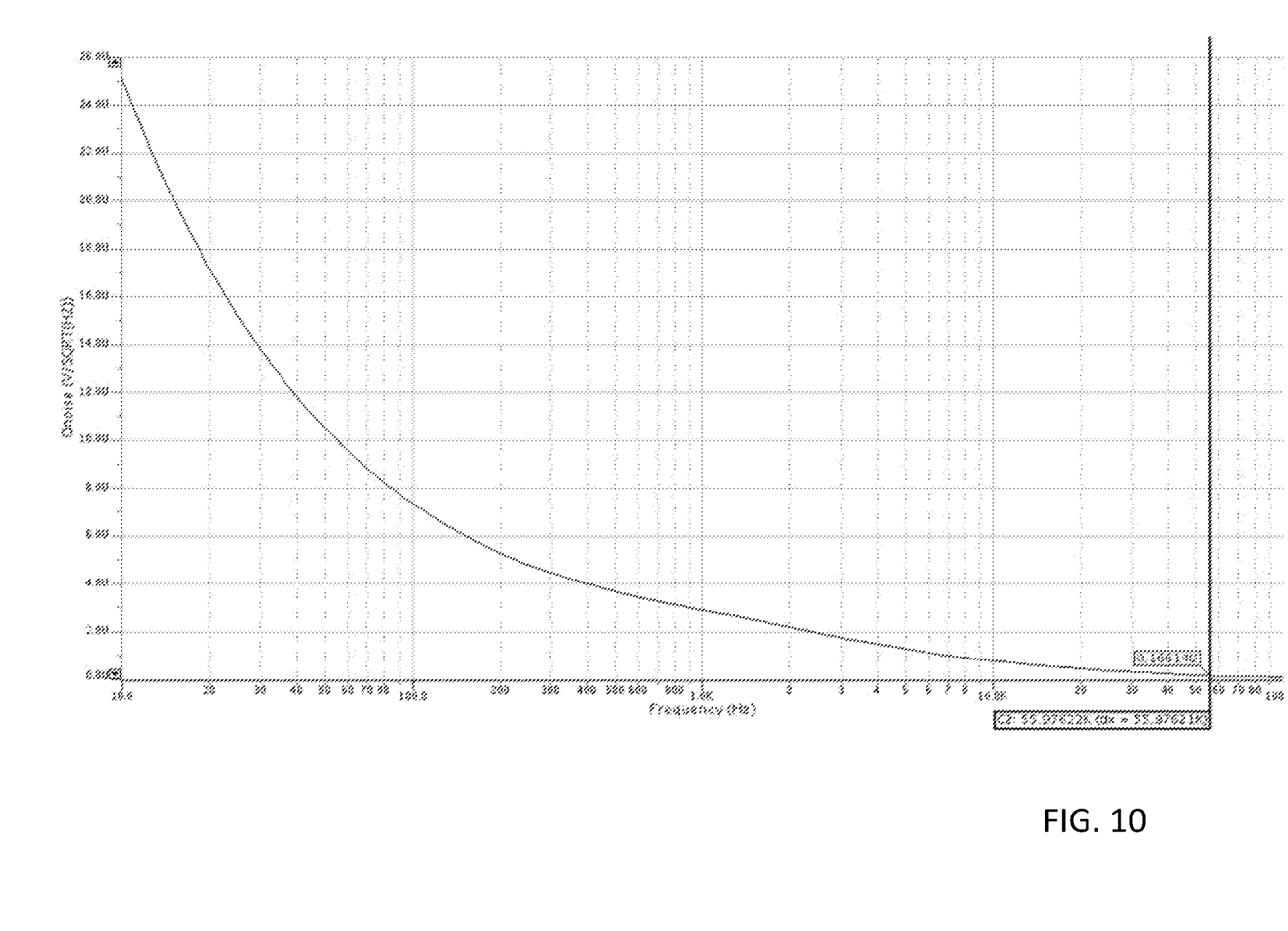
FIG. 10 illustrates an exemplary noise density response for a simulation of the path of FIG. 7.

A simulation of the path 220 of FIG. 7 was performed to determine the noise density of the path. FIG. 10 illustrates the output noise response of the fixed gain amplifier 110 and programmable gain amplifier (PGA) 228 (with the analog-to-digital converter (ADC) 232 as load) with Gf=34 and Gp=1. Similar results were achieved for other programmable gain (Gp) values. The table below summarizes the noise density response analysis:

| Gp | Gf | Vn(out) (nV/√Hz) at GBW |
|---|---|---|
| 1 | 34 | 165.9 |
| 4 | 34 | 161.0 |
| 8 | 34 | 162.2 |
| 16 | 34 | 167.6 |
| 32 | 34 | 168.6 |

In this simulation, the Vn(out) thermal noise comprises more than the resistor 4kTR noise. Furthermore, the Vn(out) values at GBW are lifted up by the 1/f noise component. However, chopper circuit stabilization frequency at too low a frequency value will fold back some 1/f noise. Thus Vn(out) at GBW is a good estimate of the intrinsic thermal noise level.

It is possible to estimate total noise due to thermal noise using the following equation:

$$\text{TotalNoise} = Vn(out) * \sqrt{F(-3\text{dB})}$$

The FSR at the output of the fixed gain amplifier is given by the following equation:

$$FSR = \frac{VREF}{Gp}$$

The following equation can then be used to estimate possible resolution if the only limitation is due to thermal noise:

$$N = \log_2\left(\frac{FSR}{TotalNoise}\right) + 1$$

The following table illustrates results for the calculation of total noise, FSR and thermal noise limited resolutions for a variety of programmable gain (Gp) values:

| Gp | Total Noise (uV) | FSR (mV) | N (bits) |
|---|---|---|---|
| 1 | 8.337 | 1440 | 18.4 |
| 4 | 8.046 | 360 | 16.4 |
| 8 | 8.055 | 180 | 15.4 |
| 16 | 8.274 | 90 | 14.4 |
| 32 | 8.144 | 45 | 13.4 |

Figure 11A:
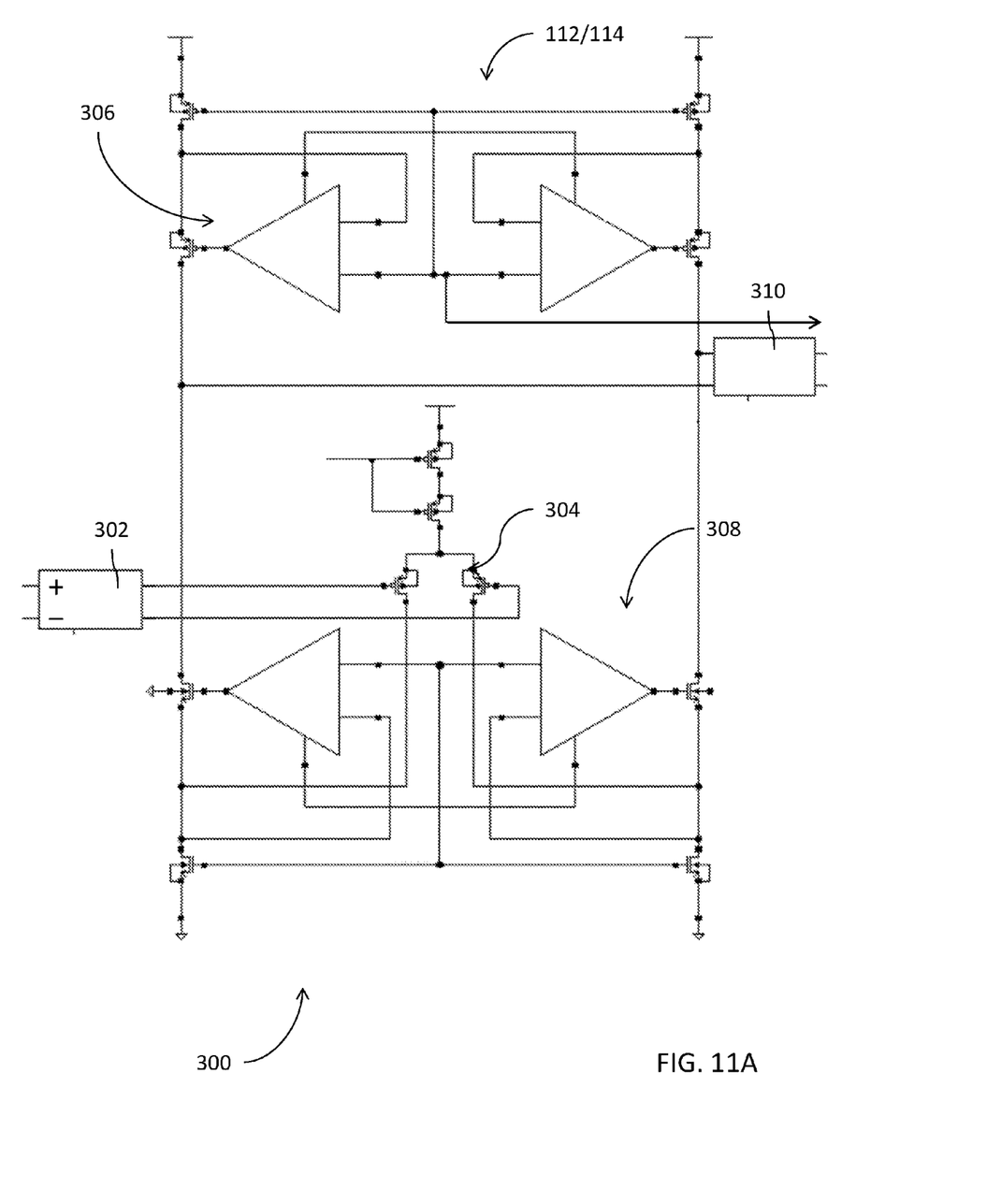
FIGS. 11A-11B are schematic diagrams for an exemplary implementation of an operational amplifier with variable drive current.
Figure 11B:
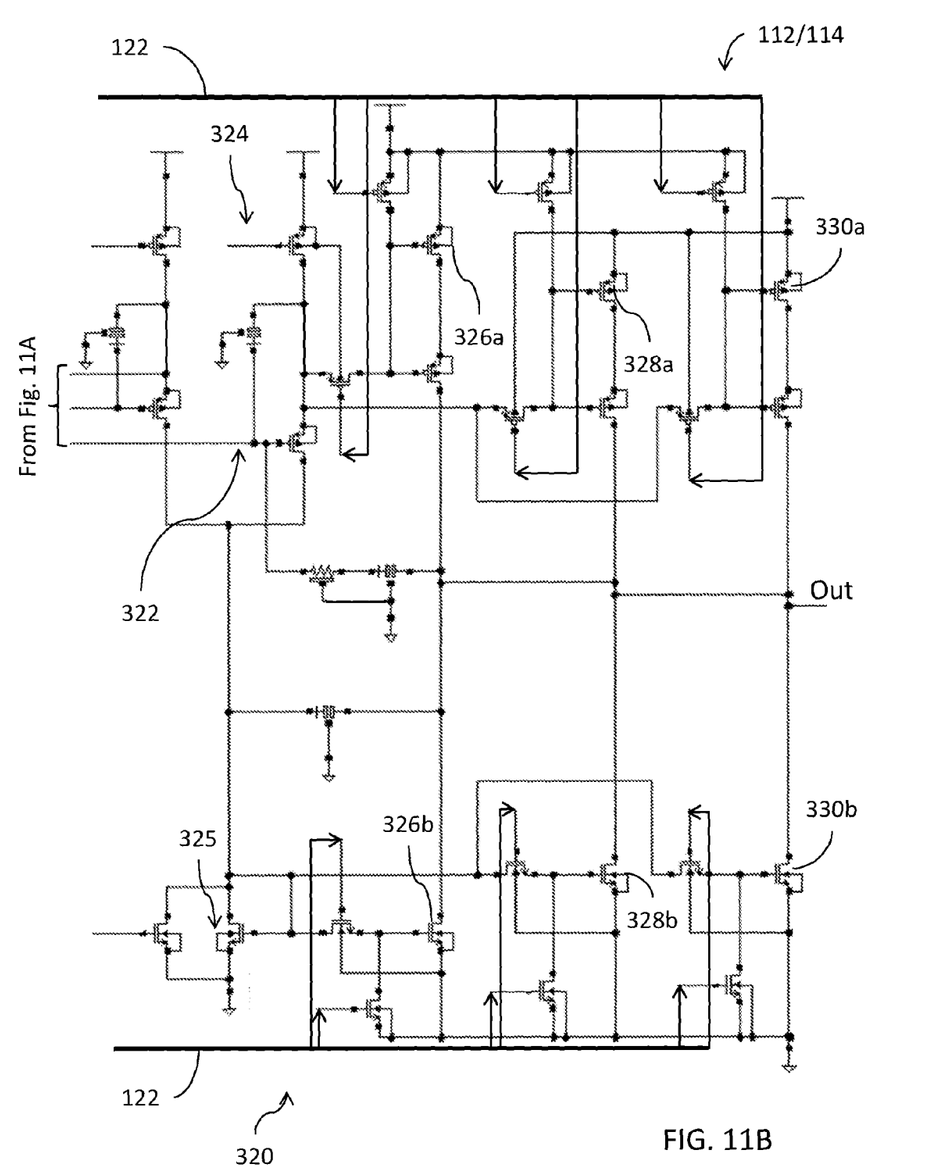

Reference is now made to FIGS. 11A-11B which illustrate schematic diagrams for an exemplary implementation of an operational amplifier 112/114 with variable drive current.

FIG. 11A illustrates the differential input stage 300 of the amplifier 112/114. A modulating chop switch circuit 302 is coupled to receive the differential input. The modulating chop switch circuit 302 functions to minimize offset and 1/f noise in the input signal. The output of the chop switch circuit 302 is applied to a differential pair of input transistors 304. The input stage 300 further includes a differential load circuit coupled to outputs of the input transistors 304. The load circuit includes a PMOS differential load circuit 306 which provides for gain boosting, and an NMOS differential load circuit 308 which provides for gain boosting. The differential output from the load circuit is applied to the input of a demodulating chop switch circuit 310 which functions to minimize offset and 1/f noise in the output signal. See, for example, Kerth, "An Oversampling Converter for Strain Gauge Transducers", IEEE Journal of Solid-State Circuits, vol. 27, no. 12, December 1992 (incorporated by reference).

FIG. 11B illustrates the variable drive current circuit 320 of the amplifier 112/114. The differential output from the input stage 300 is applied to a differential pair of input transistors 322. The source follower load 324 on the transistors 322 defines a reference current for generating the variable output drive current. The same reference current flows through a diode-connected transistor 325. A pair of drive transistors, one PMOS and one NMOS having series coupled source-drain paths, is provided for each selectable drive current. The circuit of FIG. 11B uses three such transistor pairs 326a/326b, 328a/328b and 330a/330b. Through current mirroring control, the current generated by each transistor pair is referenced to the reference current provided through the load 324 and transistor 325. The single ended output node is coupled between the transistors in each transistor pair.

In an exemplary embodiment, the transistor pair 326a/326b (providing drive circuit IDrive1) is configured to provide 4 µA. A of drive current, the transistor pair 328a/328b (providing drive circuit IDrive2) is configured to provide 6 µA of drive current and the transistor pair 330a/330b (providing drive circuit IDrive3) is configured to provide 10 µA of drive current. The transistors of each pair are controlled for actuation through a control circuit coupled to the transistor gates, with the control circuit for each drive circuit formed by a pair of transistors configured to receive complementary enable signals from the data bus 122. With respect to the example provide above: the drive current of 6 µA is provided by selectively enabling the drive circuit IDrive2; the drive current of 10 µA is provided by selectively enabling the drive circuit IDrive3; the drive current of 14 µA is provided by selectively enabling the drive circuits IDrive 1 and IDrive3; and the drive current of 20 µA is provided by selectively enabling the drive circuits IDrive1, IDrive2 and IDrive3.

It will be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   a differential amplifier having a plurality of selectively enabled current drive sources coupled to an output;
   a resistor circuit coupled to the differential amplifier and having a variable resistance;
   a control circuit configured to select the variable resistance of the resistor circuit to implement a fixed gain at the output and further selectively enable the current drive sources, said control circuit receiving an indication of a downstream programmable gain; and
   wherein a number of the current drive sources that are enabled by the control circuit is proportional to the downstream programmable gain.

2. The circuit of claim 1, wherein the resistor circuit comprises:
   a first resistor having a first variable resistance coupled between the output and inverting input of the first differential amplifier; and
   a second resistor having a second variable resistance coupled to the inverting input of the first differential amplifier.

3. The circuit of claim 2, wherein the first and second variable resistances selected by the control circuit are scaled inversely with respect to the downstream programmable gain.

4. The circuit of claim 2, wherein the first resistor comprises a plurality of first resistances selectively connectable in parallel in response to said control circuit.

5. The circuit of claim 2, wherein the second resistor comprises a plurality of second resistances selectively connectable in parallel in response to said control circuit.

6. The circuit of claim 1, further comprising a programmable gain amplifier having an input coupled to the output of the differential amplifier, said programmable gain amplifier configured to implement said downstream programmable gain.

7. A circuit, comprising:
   an instrumentation amplifier including an operational amplifier and first and second resistors coupled to the operational amplifier for gain setting, wherein the operational amplifier includes selectively enabled current drive sources coupled to an amplifier output;
   wherein the first and second resistors each have a variable resistance; and
   a control circuit configured to select the variable resistances of the first and second resistors to implement a fixed gain for the instrumentation amplifier, the selected variable resistances of the first and second resistors being scaled inversely with respect to a downstream programmable gain;
   wherein said control circuit is further configured to selectively enable a number of the current drive sources proportionally with respect to the downstream programmable gain.

8. The circuit of claim 7, further comprising a programmable gain amplifier having an input coupled to the output of the instrumentation amplifier, said programmable gain amplifier configured to implement said downstream programmable gain.

9. The circuit of claim 8, wherein the programmable gain amplifier is a component of a modulation circuit.

10. The circuit of claim 8, further comprising an analog-to-digital converter circuit coupled to an output of the programmable gain amplifier.

11. The circuit of claim 7, wherein the first resistor comprises a plurality of first resistances selectively connectable in parallel in response to said control circuit.

12. The circuit of claim 7, wherein the second resistor comprises a plurality of second resistances selectively connectable in parallel in response to said control circuit.

13. A method, comprising:
  setting a fixed gain of an instrumentation amplifier;
  receiving an indication of a downstream programmable gain; and
  enabling a number of output current drive sources of the instrumentation amplifier proportionately with respect to the downstream programmable gain.

14. The method of claim 13, further comprising amplifying an output of the instrumentation amplifier in accordance with said downstream programmable gain.

15. The method of claim 14, wherein amplifying the output further comprises modulating the output of the instrumentation amplifier.

16. The method of claim 14, further comprising converting the output of the instrumentation amplifier from an analog signal to a digital signal.

17. The method of claim 13, wherein setting the fixed gain comprises setting variable resistances of resistors of the instrumentation amplifier to implement the fixed gain.

18. The method of claim 17, wherein the resistors including a first resistor and a second resistor, and setting variable resistances comprises selecting the variable resistances scaled inversely with respect to the downstream programmable gain.

* * * * *

UNITED STATES PATENT AND TRADEMARK OFFICE
CERTIFICATE OF CORRECTION

PATENT NO.        : 9,755,597 B2
APPLICATION NO.   : 14/971359
DATED             : September 5, 2017
INVENTOR(S)       : Davy Choi It is certified that error appears in the above-identified patent and that said Letters Patent is hereby corrected as shown below:

In the Specification

At Column 9, Line number 37, please replace the term [[4 µA. A]] with the correct term -- 4 µA --.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*